United States Patent
Cao

(10) Patent No.: US 7,346,122 B1
(45) Date of Patent: Mar. 18, 2008

(54) DIRECT MODULATION OF A POWER AMPLIFIER WITH ADAPTIVE DIGITAL PREDISTORTION

(76) Inventor: Weixun Cao, 10175 McLaren Pl., Cupertino, CA (US) 95014

( * ) Notice: Subject to any disclaimer, the term of this patent is extended or adjusted under 35 U.S.C. 154(b) by 712 days.

(21) Appl. No.: 10/645,261

(22) Filed: Aug. 20, 2003

Related U.S. Application Data

(60) Provisional application No. 60/404,950, filed on Aug. 21, 2002.

(51) Int. Cl.
  H04K 1/02 (2006.01)
  H04L 25/03 (2006.01)
  H04L 25/49 (2006.01)
(52) U.S. Cl. ........................ 375/296; 375/285
(58) Field of Classification Search ........ 375/295–297, 375/284–285, 229, 371–372, 375–376; 332/100, 332/127, 159, 161
  See application file for complete search history.

(56) References Cited

U.S. PATENT DOCUMENTS

| | | | | |
|---|---|---|---|---|
| 4,972,440 | A * | 11/1990 | Ernst et al. ................ | 375/296 |
| 5,661,425 | A * | 8/1997 | Minoda et al. ............ | 327/159 |
| 6,018,275 | A * | 1/2000 | Perrett et al. .............. | 332/127 |
| 6,236,267 | B1 | 5/2001 | Anzil ........................ | 330/149 |
| 6,366,177 | B1 * | 4/2002 | McCune et al. ........... | 332/103 |
| 6,373,902 | B1 * | 4/2002 | Park et al. ................. | 375/296 |
| 6,480,704 | B1 * | 11/2002 | Pakonen .................... | 455/126 |
| 6,834,084 | B2 * | 12/2004 | Hietala ...................... | 375/296 |
| 6,975,687 | B2 * | 12/2005 | Jackson et al. ............ | 375/297 |
| 2002/0080891 | A1 * | 6/2002 | Ahn et al. .................. | 375/297 |
| 2002/0196864 | A1 * | 12/2002 | Booth et al. ............... | 375/296 |
| 2003/0184374 | A1 * | 10/2003 | Huang et al. .............. | 330/149 |
| 2003/0206056 | A1 * | 11/2003 | Hietala ...................... | 330/100 |
| 2004/0208157 | A1 * | 10/2004 | Sander et al. .............. | 370/345 |

OTHER PUBLICATIONS

D. C. Cox, "Linear Amplification using Nonlinear Components", IEEE Transactions on Communications, vol. COM-22, Dec. 1974, pp. 1942-1945.
L. R. Kahn, "Single-sideband transmission by envelope elimination and restortation", Proceedings of the IRE, vol. 40, Jul. 1952, pp. 803-806.
A. S. Wright and W.G. Durtler, "Experimental Performance of an Adaptive Digital Linearized Power Amplifier", IEEE Trans. on Vehicular Technology, vol. 41, No. 4, Nov. 1992, pp. 395-400.
M. H. Perrot, T. L. Tewksburg III, C. G. Sodini, "A 27-mW CMOS Fractional-N Synthesizer Using Digital Compensation for 2.5-Mb/s GFSK Modulation", IEEE Journal of Solid-State Circuits, vol. 32, No. 12, Dec. 1997, pp. 2048-2060.

* cited by examiner

*Primary Examiner*—Jean B. Corrielus
(74) *Attorney, Agent, or Firm*—Joe Zheng

(57) ABSTRACT

Techniques for direct modulation of a switching-mode power amplifier with adaptive digital predistortion are disclosed. A baseband digital modulated signal is decomposed into an amplitude signal and a phase signal in polar coordinates. The amplitude signal is used to modulate supply voltages of the power amplifier. The phase signal is used to modulate a voltage-controlled oscillator (VCO) of a phase-locked loop (PLL), which generates a phase-modulated radio-frequency (RF) carrier coupled to the input of the power amplifier. The digital predistortion is implemented by using a feedback demodulator, which regenerates the baseband amplitude and phase information from the output of the power amplifier. The VCO drift and other non-linear effects of the power amplifier are compensated. High power efficiency and high linearity for different modulation standards are achieved.

26 Claims, 6 Drawing Sheets

DIRECT MODULATION OF A POWER AMPLIFIER WITH ADAPTIVE DIGITAL PREDISTORTION

CROSS REFERENCE TO RELATED APPLICATION

This application claims the benefit of U.S. Provisional Application entitled "Direct Power Amplifier Modulation With Adaptive Digital Predistortion", No. 60/404,950, filed on Aug. 21, 2002, the content of which is hereby incorporated by reference for all purpose in its entirety.

BACKGROUND OF THE INVENTION

1. Field of the Invention

The present invention relates generally to the field of digital wireless communications. Specifically, the present invention relates to architectures of a digitally controlled radio frequency (RF) transmitter system. More specifically, the present invention relates to transmitter architectures that can operate in different modulation standards and different frequency bands by using substantially same building blocks.

2. Description of the Related Art

The fast growing demand for mobile communication systems has created many modulation (or speed) standards involving various rates and ways devices communicate with each other. These common modulation standards, such as GSM and the third generation (3G) for mobile radio standards, have compelled transmitter designers to combine different modulation standards in one device while maintaining high linearity, high power efficiency and low cost.

Particularly, the power efficiency is of great importance to portable devices (e.g., cellular phones and palm computers) employing different modulation standards, since the power amplifier is a main determinant of battery talk time. The requirements of high linearity, high power efficiency and low cost result in a strong restriction on the implementation of a RF transmitter which must have both ultra-linearity and high power efficiency for constant and non-constant envelope modulation standards.

Conventional RF transmitter architectures follow a linear approach in which the modulation of a power amplifier is performed in a linear region. However, such an operation leads to a significant decrease in the power efficiency. In order to achieve both high linearity and high power efficiency, the power efficient non-linear switching-mode power amplifier has been used with linearization techniques.

There are at least three different linearization approaches: the Linear Amplification with Nonlinear Components (LINCs) technique, the Envelope Elimination and Restoration (EER) technique and predistortion. The basic principle of LINCs technique, as illustrated in FIG. 1 and described in the article "Linear Amplification using Nonlinear Components" by D. C. Cox, IEEE Trans. on Communications, Vol. COM-22, pages 1942 to 1945, December 1974, is to take an envelope modulated bandpass signal and decompose it through a signal decomposer 102 into two out-phased constant envelop signals that are respectively applied to a pair of highly nonlinear power efficient amplifiers 104 (PA1) and 106 (PA2). The outputs from the amplifiers 104 and 106 are summed through a passive combiner 108. The major advantage of the LINC transmitter 100 is that the RF amplification is performed by two highly efficient non-linear amplifiers (e.g., class-C, D or E), each operating on constant envelope signals. However, one of the disadvantages of this technique is the extremely tight tolerances on the matching of the two amplifier paths to achieve acceptable small out-of-band rejection. Another one of the drawbacks encountered with this technique is that the output power combiner will introduce a significant loss of power efficiency.

The Envelop Elimination and Restoration (EER) technique, as illustrated in FIG. 2 and described in the article "Single-sideband transmission by envelope elimination and restoration" by Leonard. R. Kahn, Proceedings of the IRE, Vol. 40, pages 803 to 806, July 1952, is to apply an input RF signal to an Envelope Detector 210 to generate an amplitude-modulated signal, and a Hard Limiter 212 to generate a phase-modulated signal. Since the RF power amplifier 216 is freed from the requirement to amplify non-constant envelope signals, the amplitude-modulated signal from the Envelope Detector 210 can control the amplitude of the switching-mode power amplifier 216 through an adjustment of its bias and supply voltage via an amplitude controller 214. As the phase-modulated signal from Hard Limiter 212 has a constant envelope, it can thus be implemented by one of the switching-mode RF power amplifier classes (e.g. Class D, E or F) that feature very high DC to RF power conversion efficiency. However, any mismatch between the analog phase and the amplitude signals must be minimized. This is difficult since the two paths include vastly different types of circuit elements, working at widely different frequencies.

Predistortion is a well-known concept where the input signal is modified in order to compensate for the distortion introduced by a power amplifier when it is operating in nonlinear mode. The basic form of a predistortion linearization scheme is shown in FIG. 3. The predistorter 320 with a function $P(V_{in})$ operates on the input signal $V_{in}$ in such a manner that its output signal X is distorted in a precisely complementary manner to the distortion produced by the power amplifier 322 with a transfer function F(X). As a result, the output signal $V_{out}$ is therefore, ideally, an amplified, but undistorted replica of the input signal with a transfer function $F(P(V_{in}))$. The task of the adaptive predistortion is to adaptively predistort the input samples in order to minimize the errors. The switching-mode power amplifier has inherent non-linearities associated with them. These non-linearities are due to the fact that the amplifier's gain and phase characteristics change with a change in the power supply voltage, and thus the signal dependent power supply voltage is a source of amplitude to amplitude (AM-AM) and amplitude to phase (AM-PM) distortion. The adaptive predistortion adjusts the modulation signal by inverse characteristic of the power amplifier. Thus, the overall response of the cascaded predistorter and power amplifier demonstrates linearity. Some experimental results and demonstrating are given in the article "Experimental Performance of an Adaptive Digital Linearized Power Amplifier" by Andrew S. Wright and Willem G. Durtler, IEEE Transactions on Vehicular Technology, Vol. 41, No. 4, pages 395-400, November 1992. The main advantage of the digital predistortion is its capability for wide bandwidth operation and simplicity for the implementation.

One example of direct phase modulation is to use a fractional-N frequency synthesizer 400 as illustrated in FIG. 4. But the bandwidth of the fractional-N frequency synthesizer 400 is strongly limited by its phase-looked loop formed by a divider 404, a phase detector 403, a loop filter 402 and a VCO 401. In particular, the article "A 27-mW CMOS Fractional-N Synthesizer Using Digital Compensation for 2.5-Mb/s GFSK Modulation" by Michael H. Perrott and etc., IEEE Journal of Solid-State Circuits, Vol. 32, No. 12, December 1997, pages 2048 to 2060, describes a wideband fractional-N synthesizer. It requires a compensated transmit filter which is difficult to implement, and an accurate loop filter to mitigate the mismatch problem. However, this approach is not efficient and suitable for the phase modulation with different modulation standards.

There is thus a great need for a generic RF transmitter architecture that can maximize the power efficiency with wide bandwidth and high linearity for different modulation standards at low cost.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention pertains to a generic RF transmitter architecture using a switching-mode power amplifier to maximize the power efficiency and method therefor. According to one aspect of the present invention, RF transmitter systems employing the present invention can achieve both high power efficiency and high linearity for different modulation standards but be of low cost. The present invention may be advantageously used in the mobile devices and/or base stations (e.g., the third generation (3G) wireless communication systems and advanced satellite communication systems).

The RF transmitter architecture contemplated in the present invention provides a generic RF transmitter design platform from baseband digital signal processing up to RF transmission signal. Some of the features, advantages and benefits are listed as below:

- high power efficiency is obtained by using switching-mode RF amplifiers;
- accurate digital predistortion of switching-mode RF amplifiers is achieved by using digital signal processing technique with separated amplitude and phase demodulated feedback paths;
- a desired signal is generated directly at RF without requiring intermediate frequency (IF) and up-conversion mixer and costly band pass filter;
- an instantaneous wideband modulated frequency is directly manipulated by using feed forward phase modulation technique combined with a phase-locked loop;
- different modulation standards and different frequency bands are accommodated;
- high performance linear modulation of RF signals with low output noise power, spurious levels and current consumption are achieved; and
- the costly Surface Acoustic Wave (S.A.W) filters traditionally used in conventional digital radio transmitter architectures are eliminated.

The present invention may be implemented in numerous ways. According to one embodiment, the present invention is a transmitter operating in a switching-mode, the transmitter comprises a signal decomposition unit decomposing a modulated digital signal into a first signal (amplitude) and a second signal (phase), both being expressed in polar coordinates mathematically; an adaptive predistorter distorting the first and second signals respectively in accordance with one or more of distorting parameters; a phase equalizer equalizing a time delay between the first and second signals in response to a measurement provided by a feedback loop operating on a sample of a RF signal from the transmitter; and a power amplifier, controlled by the first signal and a control signal from a voltage controlled oscillator, producing the RF signal, wherein the control signal is derived from the second signal.

According to another embodiment, the present invention is a method for controlling a transmitter to operate in a switching-mode, the method comprises decomposing a modulated digital signal into a first signal (e.g., amplitude) and a second signal (e.g., phase), both being expressed in polar coordinates mathematically; distorting the first and second signals respectively in accordance with one or more of distorting parameters; equalizing a time delay between the first and second signals in response to a measurement provided by a feedback loop operating on a sample of a RF signal from the transmitter; and producing the RF signal in a power amplifier controlled by the first signal and a control signal from a voltage controlled oscillator, wherein the control signal is derived from the second signal.

There are many features, benefits and advantages in the present invention. One of these is to provide a generic architecture that uses amplitude and phase information to directly modulate a switching-mode power amplifier with adaptive digital predistortion. The digital predistortion includes a demodulation feedback path to detect the amplitude and phase signals generated by the power amplifier and the voltage-controlled oscillator, and adaptively correct the non-linear effects of the switching-mode power amplifier and the voltage-controlled oscillator. The timing mismatch between the amplitude and phase signals is also adaptively compensated by using digital predistortion.

Another one of the features, benefits and advantages is to provide a wideband phase modulation architecture using the direct modulation of a VCO with a fractional-N frequency synthesizer. It eliminates the intermediate frequency (IF) up-conversion mixer and costly band pass filters for conventional transmitter chains. The VCO drift, temperature variations and other nonlinear effects of a power amplifier are compensated by using digital predistortion with adaptive phase offset and gain control techniques.

Other objects, features, benefits and advantages, together with the foregoing, are attained in the exercise of the invention in the following description and resulting in the embodiment illustrated in the accompanying drawings.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE PREFERRED EMBODIMENTS

The present invention pertains to a generic RF transmitter architecture using a switching-mode power amplifier to maximize the power efficiency and method therefor. According to one aspect of the present invention, a transmitter design architecture is provided to use amplitude and phase information to directly modulate a switching-mode power amplifier with adaptive digital predistortion. The digital predistortion includes a demodulation feedback path to detect the amplitude and phase signals generated by the power amplifier, and adaptively correct the non-linear effects of the switching-mode power amplifier. The timing mismatch between the amplitude and phase signals is also adaptively compensated by using digital predistortion.

The detailed description of the present invention is presented largely in terms of functional blocks, procedures, logic blocks, processing, or other symbolic representations that directly or indirectly resemble the operations of a RF transmitter that can be used in wireless communications. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 5:
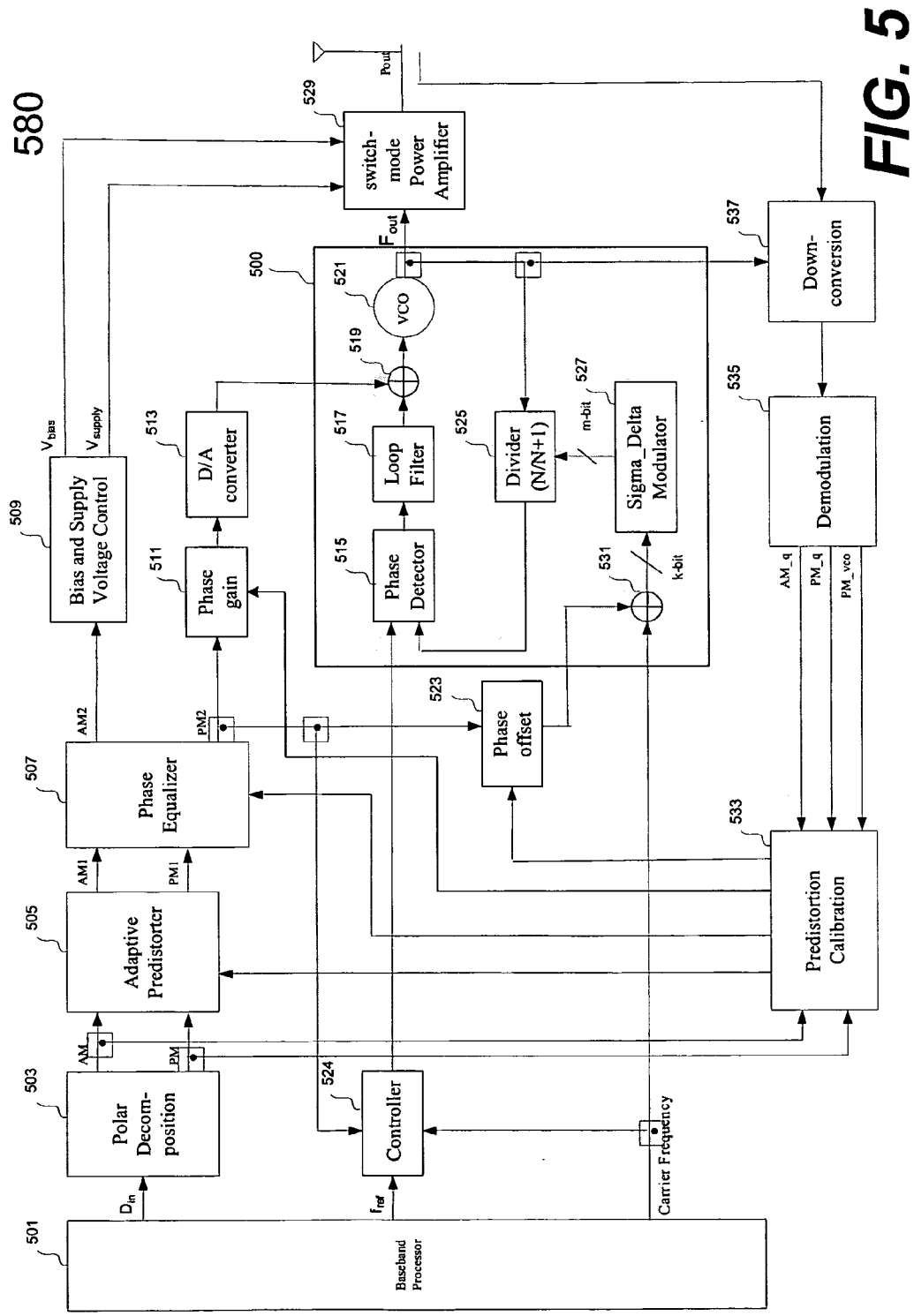
FIG. 5 is a block diagram of a transmitter architecture using direct modulation of a power amplifier with adaptive digital predistortion in accordance with one embodiment of the present invention.

Referring now to the drawings, in which like numerals refer to like parts throughout the several views. FIG. 5 illustrates a functional block diagram of part of a transmitter 580 that may be employed in a base station or a mobile device. For example, a base station controls radio or telecommunication links with the mobile devices that include, but may not be limited to, cellular phones, mobile computing devices and laptop computers.

A baseband processor 501 provides three signals, Din, $f_{ref}$ and a carrier frequency. Din or Din(t) is a modulated digital signal and coupled to a polar decomposition 503 to generate a phase-modulated signal PM, and an amplitude-modulated signal AM. The two modulated output signals AM and PM are then provided to an adaptive predistorter 505. To better describe the adaptive predistorter 505, it is assumed that the input baseband signal Din(t) can be expressed as rectangular modulated signals I(t) and Q(t) as follows:

$$Din(t)=I(t)+jQ(t)$$

Din(t) can be also represented in polar coordinates after the polar decomposition 503 as:

$$Din(t)=AM(t) \cdot e^{jPM(t)}$$

where the amplitude signal $AM(t)=[I(t)+Q(t)]^{1/2}$ and the phase signal $PM(t)=\tan^{-1}[Q(t)/I(t)]$.

According to one embodiment, the adaptive predistorter 505 is designed by using a digital predistortion technique to compensate the AM-AM and AM-PM distortions that may be introduced in a switching-mode power amplifier. In operation, the adaptive predistorter 505 receives the polar decomposed AM and PM signals from the polar decomposition 503 and the control signal from the predistortion calibration 533 to generate the predistorted amplitude signal AM1 and phase signal PM1 both of which are applied to the phase equalizer 507. The parameters of the adaptive predistortion 505 are updated by the predistortion calibration 533 that calibrates feedback signals from the output of the power amplifier 529 through the demodulation 535. In other words, the outputs of the power amplifier 529 and the voltage-controlled oscillator 521 are sampled, down-converted in the down conversation 537, and demodulated in the demodulation 535 to facilitate the predistortion calibration 533 to update the parameters of the adaptive predistortion 505 such that the adaptive predistortion 505 distorts the polar decomposed AM and PM signals objectively or in a desirable way. Depending on implementation, the parameters of the adaptive predistortion 505 may pertain to those of components or are stored in a look-up-table.

As the power amplifier 529 operates in the nonlinear switching-mode, the phase modulation path and the amplitude modulation path can be individually adjusted by using the digital predistortion techniques. The outputs of the adaptive predistortion 505 can be described as:

$$AM1(t)=P_{am-am}(AM(t)) \text{ and } PM1(t)=P_{am-pm}(PM(t)),$$

where $P_{am-am}(x)$ and $P_{am-pm}(x)$ are the predistortion functions for AM-AM and AM-PM distortion, respectively.

The phase equalizer 507 is used to equalize a time delay between the phase-modulation path and the amplitude-modulation path, if there is any. In operation, the phase equalizer 507 receives a feedback control signal from the predistortion calibration 533 to adjust the time delay (difference) between the two output signals which are the amplitude-modulated signal AM2 and the phase-modulated signal PM2. The amplitude signal AM2 is coupled to the bias and supply voltage control 509 that controls the supply voltage of the switching-mode power amplifier 529. The phase signal PM2 is applied to the phase gain 511 that uses a gain control signal produced by the predistortion calibration 533 to control the scaling factor of the received phase signal PM2. The digital output of the phase gain 511 is converted to an analog signal by a digital-to-analog (D/A) converter 513. The output of the digital-to-analog converter 513 is added to an adder 519 to direct modulate VCO 521 in the fractional-N PLL modulation 500.

At the same time, the phase signal PM2 is also applied to the phase offset 523 for the fractional-N PLL modulation 500 that is used to track the carrier frequency of VCO 521. In operation, a modulated signal from the loop filter 517 is coupled to the adder 519 such that the VCO 521 operates with two signals. By using the feed-forward phase modulation through the D/A converter 513, a change in the phase gain value will result in an equivalent change in the modulation gain of VCO 521. Thus, the nonlinear effect of VCO gain drift can be adaptively compensated by predistorting the scaling value of the phase gain 511. Also, a controller 524 receives the phase-modulated baseband signal and the carrier frequency signal to produce a signal to control a reference frequency coupled to an input of the phase detector 515.

As shown in the figure, the phase offset 523 uses a phase offset control signal produced by the predistortion calibration 533 to adjust the phase value of the phase signal PM2. The phase offset 523 adaptively compensates the carrier frequency drift due to the signal mismatch between the direct modulation path through the D/A converter 513 and the fractional-N PLL modulation path through the loop filter 517. The output of the phase offset 523 is applied to the phase data input of the fractional-N PLL modulation 500. The digital carrier frequency data is applied to the fractional-N PLL modulation 500 to produce the RF carrier frequency without using the traditional up-conversion mixer.

According to one embodiment, the fractional-N phase-locked loop (PLL) frequency synthesizer 500 is used as a functional building block in the transmitter 580. The phase-locked loop 500 includes a phase detector 515, a loop filter 517, a voltage controlled oscillator (VCO) 521 and a loop divider 525. The phase detector 515 serves as a comparator for comparing the signal from the controller 524 to the divided loop output signal from the divider 525. The phase detector 515 generates a frequency tuning control signal that is coupled to the loop filter 517. The voltage level of this frequency tuning control signal is proportional to the difference in frequencies of the compared signals. The loop filter 517 receives and filters the frequency tuning control signal and provides a control signal to the input node 519 to the VCO 521. The VCO 521 serves as a frequency generation means for generating the loop output signal $f_{out}$ in response to the VCO input control signal. The loop divider 525 is coupled to the output of the VCO 521 and generates a divided loop signal which corresponds to the frequency to the loop output signal divided by integer N or N+1. The output of the loop divider 525 is provided as the loop feedback signal to the other input of phase detector 515.

Figure 1:
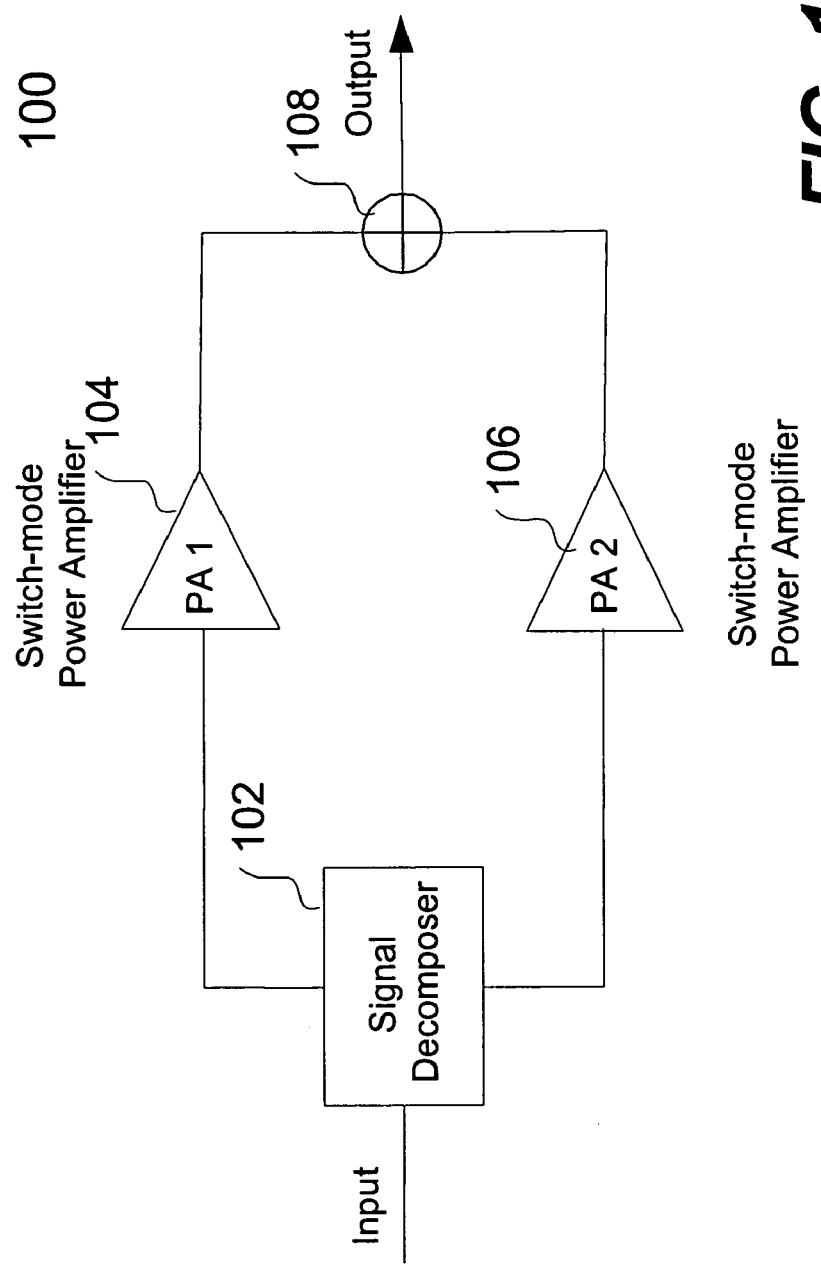
FIG. 1 is a block diagram of a basic LINC power amplifier modulator realization.
Figure 2:
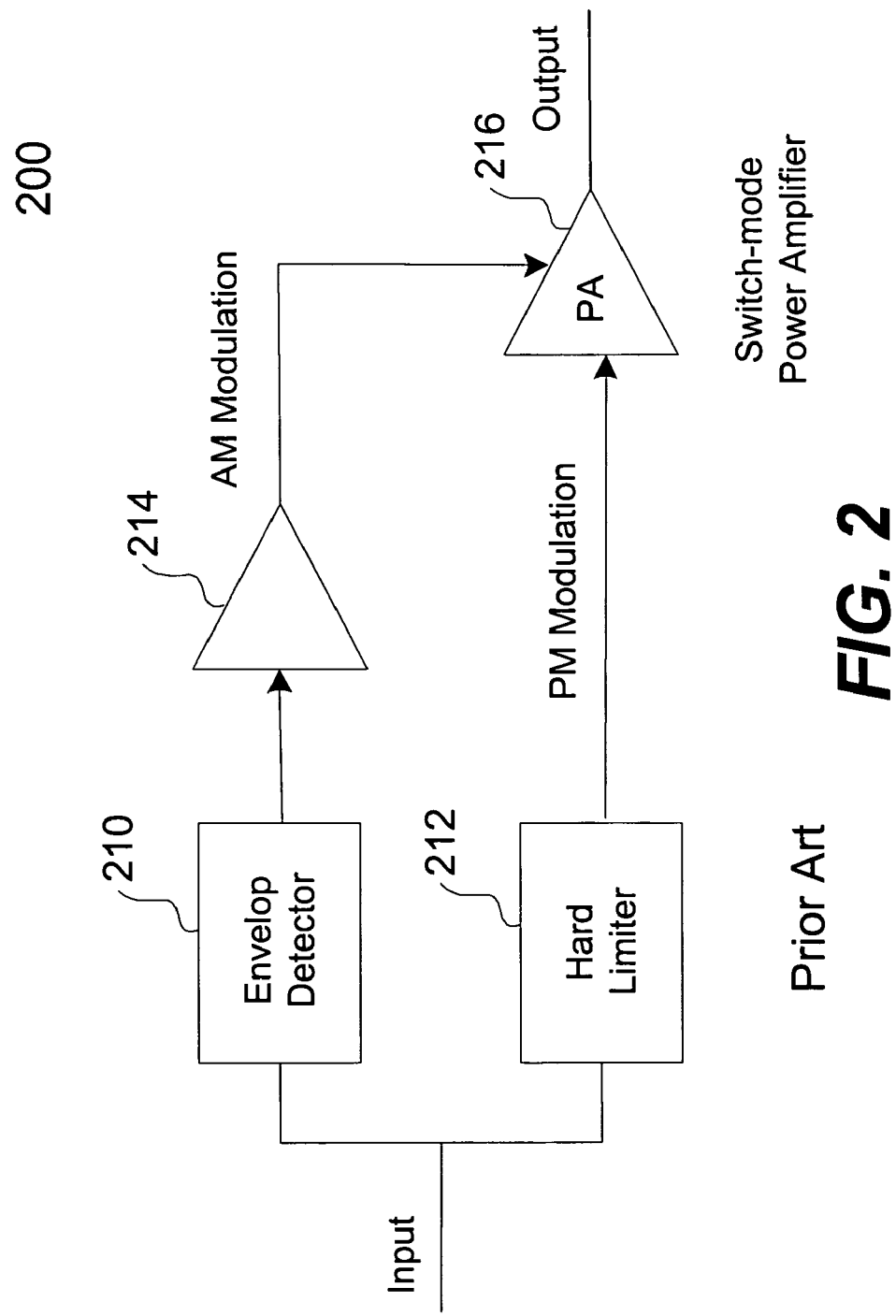
FIG. 2 is a block diagram of the Envelope Elimination and Restoration (EER) scheme for power amplifier modulation.
Figure 3:
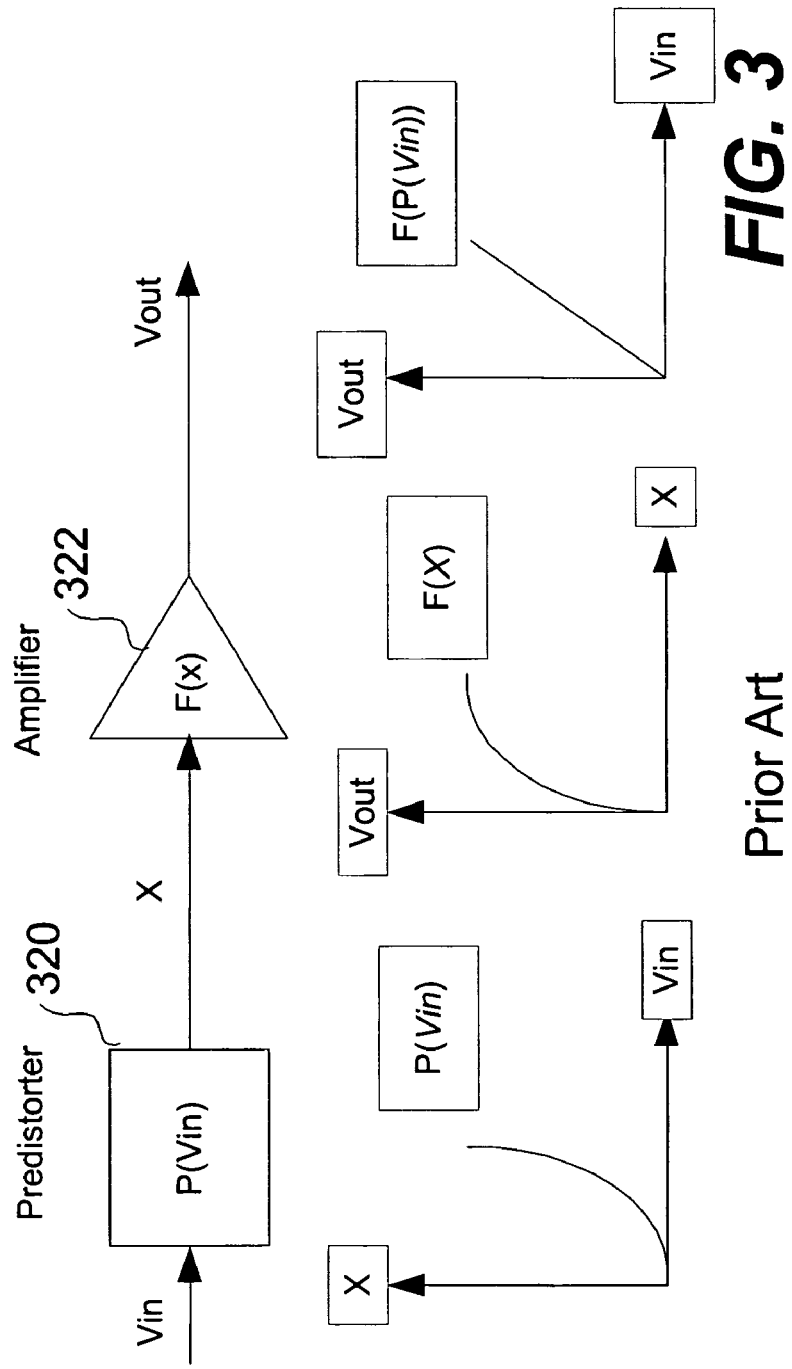
FIG. 3 is a block diagram of a predistortion linearization technique for power amplifiers.
Figure 4:
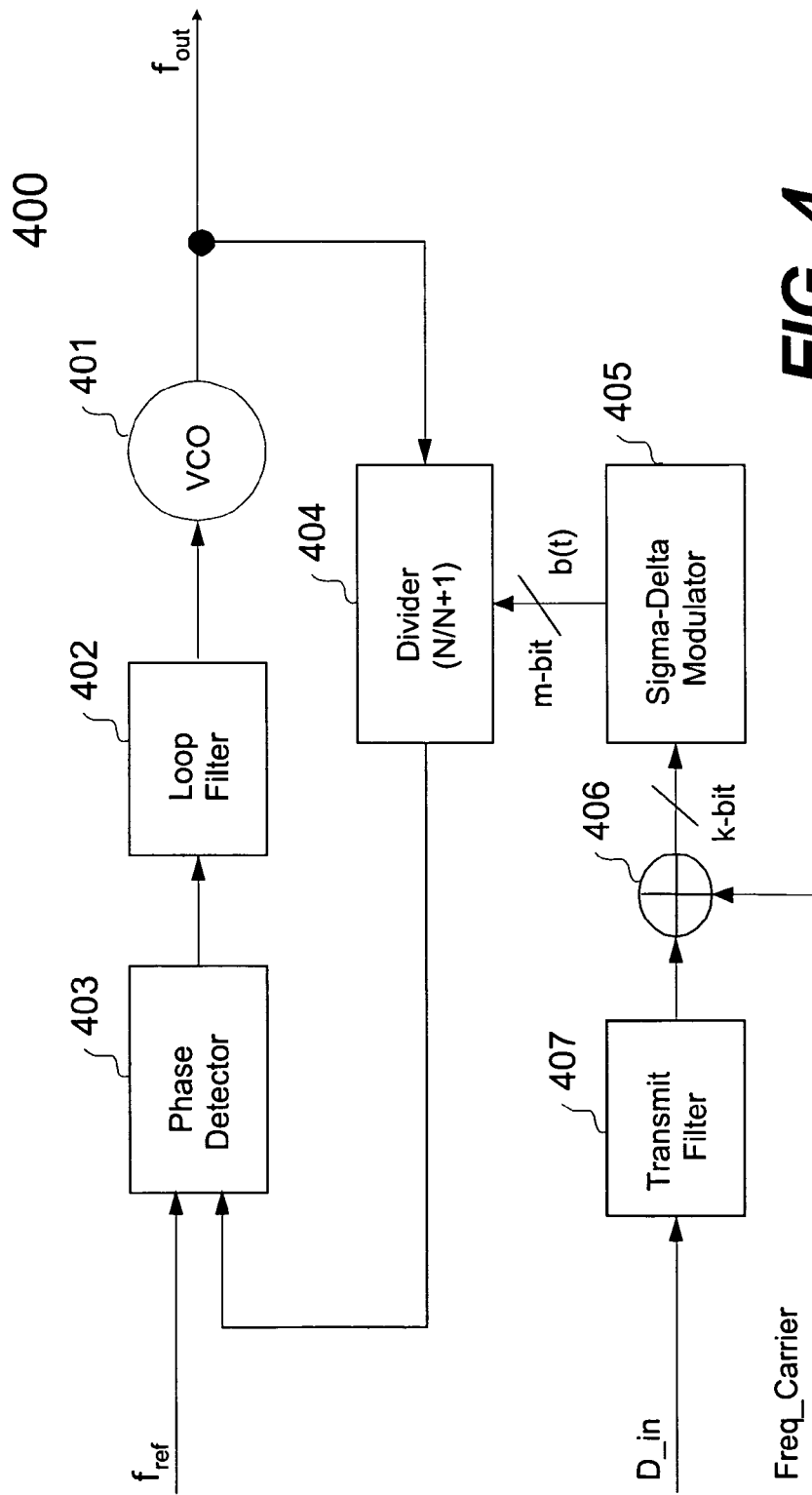
FIG. 4 is a block diagram of a conventional fractional-N phase-locked loop frequency synthesizer.

Referring now back to FIG. 4, a baseband digital data D_in is provided to the transmit filter 407 to generate a modulated data stream with smooth transition. The output of the transmit filter 407 is added to a carrier frequency, Freq_Carrier. The output of an adder 406 is provided to a sigma-delta modulator (DSM) 405 whose output changes the divide ratio of the PLL. Thus, a spurious free output signal is obtained by dithering the division ratio. The delta-sigma modulator 405 and the loop divider 504 comprise a fractional-N divider which is used in the feedback path of the PLL 400.

As a result of this approach, the desired baseband digital signal with phase information can be generated directly at the required radio frequency with no intermediate frequency (IF) conversion stages. The fraction-N division frequency synthesizer approach allows fine output frequency resolution, and reduces the overall phase noise. However, one significant drawback of the fractional-N frequency synthesizer is that the modulation bandwidth must be less than the PLL bandwidth. This constraint imposes a severe conflict between achieving high data rates and good noise performance. The high data rates require a wide PLL bandwidth, but low output noise requires a low PLL bandwidth in order to properly attenuate the sigma-delta quantization noise. Thus, the fractional-N PLL as shown in FIG. 4 is difficult to track rapid changes in the phase-modulated input signal. It is also difficult to accurately control the delay time of the modulated phase signal due to the variable delay time of the data processing paths from the input through the transmitter filter 407 and the sigma-delta modulator 405. It can be appreciated that these problems can be readily solved by the architecture 580 of FIG. 5.

Referring to FIG. 5, there are in fact two phase modulation paths: one is the feed-forward modulation path through the phase gain 511 and the other is the fractional-N PLL modulation path through the phase offset 523. These two paths are adaptively controlled by the predistortion calibration 533 to have the same gain performance for the phase modulation by monitoring the output frequency of VCO 521. The fractional-N PLL 500 provides a tuning voltage through the loop filter 517 to the VCO 521 to track the carrier frequency. The feed-forward modulation path provides a tuning voltage through the D/A converter 513 to the VCO 521 as well to produce a phase-modulated frequency. These two tuning voltages are summed together by the adder 519 to generate the final tuning voltage applied to the VCO 521.

As the fractional-N PLL 500 is applied to track the carrier frequency without passing the modulation signal into the loop filter 517, it can be implemented using a narrow loop bandwidth. The wide bandwidth phase-modulated signal is directly up-converted to the RF signal by directly modulating the VCO 521 through the D/A converter 513. Thus, both wide bandwidth and low output noise for a phase modulation can be achieved.

The predistortion calibration 533 produces the control signals for the adaptive digital predistortion by comparing the digital baseband phase-modulated signal PM and amplitude-modulated signal AM to the demodulated feedback signals labeled respectively as AM_q, PM_q and PM_vco generated from the demodulation 535. The comparing results are used to produce the predistortion control signals to update the parameters for the adaptive predistorter 505, the phase equalizer 507, the phase offset 523 and the phase gain 511.

The demodulation 535 translates the down-converted signals produced by the down-conversion 537 to the baseband digital signals. The demodulated output signal AM_q represents the amplitude value of the output of the power amplifier 529. The demodulated output signal PM_q represents the phase value of the output of the power amplifier 529. The demodulated output signal PM_vco represents the frequency value produced by the VCO 521. The amplitude information of the output of power amplifier 529 can be translated to a baseband digital signal AM_q by using an envelope detector. The phase information of the outputs of the power amplifier 529 and the VCO 521 can be translated to a baseband digital signal PM_q and PM_vco by using a hard limiter and an analog-to-digital converter.

The down-conversion 537 converts the output of the power amplifier 529 and the output $F_{out}$ of the VCO 521 from RF frequency down to a low intermediate frequency (IF) within a sampling range from DC up to 100 MHz. The down-converted signals are applied to the input of Demodulator 535 for demodulation processing.

Figure 6:
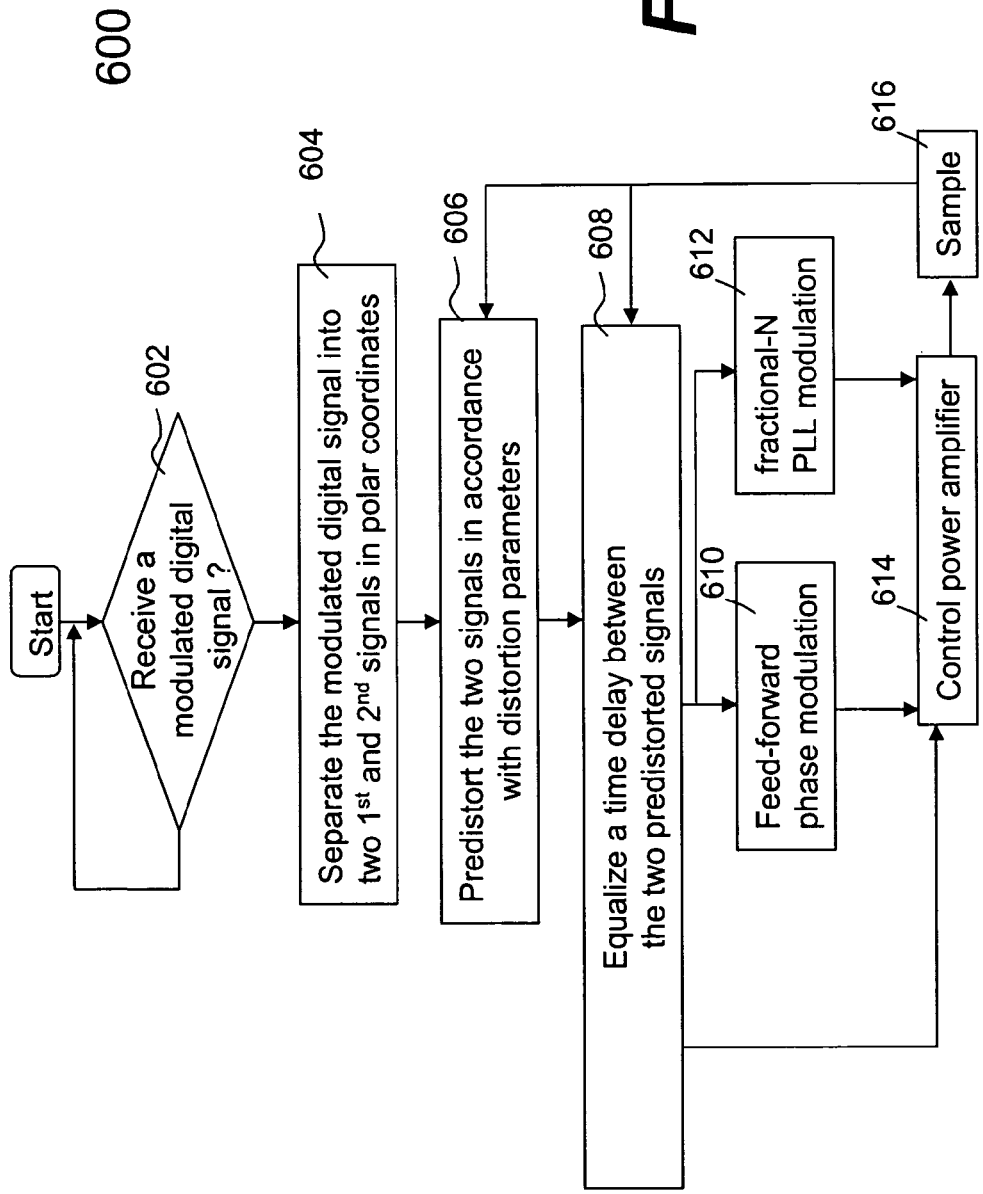
FIG. 6 shows a flowchart or process of generating a RF signal in accordance with one embodiment of the present invention.

Referring now to FIG. 6, there shows a flowchart or process 600 of generating a RF signal in accordance with one embodiment of the present invention. The process 600 may be implemented in hardware or a combination of hardware and software as a system, an apparatus or a method. FIG. 580 shows one exemplary implementation of the process 600. The process 600 may be understood in conjunction with FIG. 5.

At 602, the process 600 awaits a modulated digital signal and only proceeds when the modulated digital signal is received (e.g., from a baseband processor). At 604, the received modulated digital signal is split into two signal components (e.g., amplitude and phase) that are expressed in polar coordinates. These two signals are then respectively predistorted in accordance with a set of distortion parameters at 606. As described above, the distortion parameters are updated, adjusted or corrected by a feedback loop operating on a sample of the final RF signals.

At 608, the two predistorted signals are equalized with respect to one or more common parameters. As the two signals eventually go through two different paths to control a switching-mode power amplifier and result in a time shift, as shown in FIG. 5, a time delay between the two predistorted signals is equalized to compensate for such a time shift. Accordingly, the one or more common parameters that are used at 608 are also updated, adjusted or corrected by the feedback loop operating on a sample of the final RF signals.

As a result of 608, there are two signals, referred to as a first signal and a second signal. The first signal (e.g., an amplitude) is used to control the power amplifier that subsequently generates the RF at 614. In one embodiment, the first signal drives bias and supply voltage to control the power amplifier. The second signal (phase) is provided to two phase modulation paths at 610 and 612. At 610, a feed-forward modulation path operates on the second signal through a phase gain unit. At 612, a fractional-N PLL modulation path operates on the second signal through a phase offset unit. Not shown in FIG. 6, these two paths are adaptively controlled by the feedback loop operating on a sample of the final RF signals. The outputs of the two paths are combined to control the voltage controlled oscillator that in turn generates the phase-modulated signal to the input of the power amplifier.

At 616, the outputs from the power amplifier and the voltage controlled oscillator are sampled and used to facilitate the feedback loop to update, adjust or correct all the parameters to process the aforementioned two signals as well as the two modulation paths.

The process 600 of FIG. 6 is simple in implementation in view of the functional block diagrams in FIG. 5 as most of the functional blocks can be implemented with digital circuitry, instead of sensitive analog circuitry. All digital signal processing circuitry can be easily reconfigured for the applications with different modulation standards. The process 600 can achieve high efficiency and low noise for the implementation of a RF transmitter.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

I claim:

1. A transmitter operating in a switching-mode, the transmitter comprising:
   a signal decomposition unit decomposing a modulated digital signal into a first signal and a second signal, both being expressed in polar coordinates;
   an adaptive predistorter, coupled to the signal decomposition unit, configured to distort the first and second signals respectively in accordance with one or more of distorting parameters;
   a phase equalizer, coupled to the adaptive predistorter, configured to equalize a time delay between the distorted first and second signals in response to a first control signal provided by a feedback loop operating on a sample of an amplified RF signal to generate equalized first and second signals;
   a phase lock loop (PLL) responsive to the equalized second signal, a second control signal from the feedback loop, a reference frequency signal and a carrier frequency signal for producing a radio frequency (RF) signal, wherein a power amplifier is coupled to the PLL for receiving the RF signal and to produce said amplified RF signal responsive to the equalized first signal; and
   means for receiving and transmitting said amplified RF signal.

2. The transmitter of claim 1, wherein the modulated digital signal is provided from a baseband processor, the first signal is an amplitude signal, and the second signal is a phase signal.

3. The transmitter of claim 2, wherein the feedback loop includes a down-converter coupled to the amplifier and the output of the PLL, a demodulation unit coupled to the down-converter and a measurement unit coupled to the demodulation unit, and provides feedback signals, said feedback signals comprising at least the first and the second control signals.

4. The transmitter of claim 3, wherein the down-converter converts the sample to a lower frequency to be demodulated in the demodulation unit to produce a demodulated sample, and the demodulated sample is measured in the measurement unit for producing the feedback signals.

5. The transmitter of claim 1, wherein the equalized first signal is provided to indirectly control the power amplifier.

6. The transmitter of claim 5, wherein the equalized first signal activates a control unit to generate a bias control signal and a voltage signal in response to the equalized first signal to control the power amplifier.

7. The transmitter of claim 5, further comprising a first modulation path and a second modulation path, both operating on the equalized second signal.

8. The transmitter of claim 7, wherein the first modulation path provides a first input signal to the PLL in response to the equalized second signal processed in a phase gain unit.

9. The transmitter of claim 8, wherein the equalized second signal, after processed in the phase gain unit, is converted to an analog signal.

10. The transmitter of claim 8, wherein the second modulation path provides a second input signal to the PLL in response to the equalized second signal processed in a phase offset unit.

11. The transmitter of claim 10, wherein the PLL comprising: a phase detector responsive to the reference frequency signal and a divided loop output signal to provide an output signal; a loop filter coupled to the output of the phase detector; an adder for summing an output of the loop filter and an output of the phase offset unit; a voltage controlled oscillator coupled to an output of the adder for providing the RF signal; and a divider responsive to the RF signal and the first input signal from the first modulation path for providing the divided loop output signal.

12. A method for controlling a transmitter to operate in a switching-mode, the method comprising:
   decomposing a modulated digital signal into a first signal and a second signal, both being expressed in polar coordinates;
   distorting the first and second signals respectively in accordance with one or more of distorting parameters; and
   equalizing a time delay between the distorted first and second signals in response to a first control signal provided by a feedback loop operating on a sample of an amplified RF signal to generate equalized first and second signals;
   producing a radio frequency (RF) signal using a phase lock loop (PLL) responsive to the equalized second signal, a second control signal from the feedback loop, a reference frequency signal and a carrier frequency signal;
   amplifying said RF signal using a power amplifier responsive to the equalized first signal to produce said amplified RF signal;
   transmitting said amplified RF signal.

13. The method of claim 12, wherein the modulated digital signal is provided from a baseband processor, the first signal is an amplitude signal, and the second signal is a phase signal.

14. The method of claim 12, further comprising converting the sample of said amplified RF signal to a lower frequency to provide a converted sample; demodulating said converted sample to produce a demodulated sample, measuring the demodulated sample to produce feedback signals, wherein said feedback signals comprising at least the first and the second control signals.

15. The method of claim 12, wherein the equalized first signal is provided to indirectly control the power amplifier.

16. The method of claim 15, further comprising activating a control unit by the equalized first signal to generate a bias control signal and a voltage signal in response to the equalized first signal to control the power amplifier.

17. The method of claim 15, further comprising providing a first modulation path and a second modulation path, both operating on the equalized second signal.

18. The method of claim 17, further comprising providing a first input signal by the first modulation path to the PLL in response to the equalized second signal processed in a phase gain unit.

19. The method of claim 18, comprising converting the equalized second signal, after processed in the phase gain unit, to an analog signal.

20. The method of claim 18, further comprising providing a second input signal in the second modulation path to the PLL in response to the equalized second signal processed in a phase offset unit.

21. A method for controlling a transmitter to operate in a switching-mode, the method comprising:
    generating a radio frequency signal using a phase-locked loop (PLL) configured to receive an adaptive phase gain signal and a phase offset control signal in response to a predistorted baseband phase signal, a carrier frequency signal, a reference frequency signal, wherein the PLL includes a modulated voltage-controlled-oscillator (VCO);
    compensating a frequency drift and other non-linear effects of said modulated voltage-controlled-oscillator (VCO) and a power amplifier by predistorting a baseband amplitude signal and the baseband phase signal in accordance with one or more distorting parameters that are determined based on a sample of an output of the transmitter, wherein the baseband amplitude signal and the phase signal are expressed in terms of polar coordinates, and the sample is down-converted with an output from the VCO and demodulated to facilitate a predistortion calibration in a predistortion calibration unit to update the distorting parameters, and one output from the predistortion calibration unit used to adjust the predistorted phase signal to generate said phase gain signal;
    and
    amplifying said radio frequency signal in response to the predistorted baseband amplitude signal using the amplifier to provide said output of said transmitter.

22. The method of claim 21, wherein the sample is downconverted and demodulated using said output from the VCO to regenerate a first signal a second signal and a third signal in a digital format, the method further comprising:
    comparing the first, second and the third signals to the baseband amplitude and phase signals to output respective comparing results; and
    producing feedback control signals in response to the comparing results to update the one or more distorting parameters, and other related parameters.

23. The method of claim 22, still further comprising equalizing a delay time between the predistorted baseband amplitude and phase signals.

24. The method of claim 23, wherein the delay time is provided by one of the feedback control signals.

25. The method of claim 21, wherein the step of generating said radio frequency signal comprising:
    comparing two phase-modulated signals in a phase detector to produce an output representing the phase difference of the two phase-modulated signals, wherein one of the phase-modulated signals is said reference frequency signal provided by a controller and the other one of the phase-modulated signals is from a feedback frequency divider in the phase-locked loop;
    filtering the output of the phase detector using a loop filter;
    adding an output of the loop filter using a first adder to a signal generated based on the baseband phase signal and provide a sum signal as the input of the VCO;
    providing said feedback frequency divider in a feedback loop which is coupled to the output of the VCO;
    and
    receiving a signal in a modulator from a second adder in the phase-locked loop that couples a signal, generated based on the phase signal, and a carrier frequency signal together to produce a digital bit stream used to control a divisor of the feedback frequency divider.

26. The method of claim 21, further comprising generating said reference frequency using a controller responsive to said baseband phase signal and a carrier frequency signal.

* * * * *